United States Patent
Lee

(10) Patent No.: US 8,631,252 B2
(45) Date of Patent: Jan. 14, 2014

(54) INTEGRATED CIRCUIT CARD WITH A HIGH VOLTAGE GENERATOR THAT SELECTIVELY SUPPLYS HIGH VOLTAGE TO A FIRST AND SECOND SET OF BITLINES ASSOCIATED WITH A FIRST AND SECOND MEMORY BLOCK IN PARALELL

(75) Inventor: Seung Won Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 800 days.

(21) Appl. No.: 12/717,252

(22) Filed: Mar. 4, 2010

(65) Prior Publication Data
US 2010/0241877 A1    Sep. 23, 2010

(30) Foreign Application Priority Data

Mar. 17, 2009  (KR) ........................ 10-2009-0022602

(51) Int. Cl.
 *G06F 1/00*  (2006.01)
 *G11C 16/06*  (2006.01)

(52) U.S. Cl.
 USPC ...................... 713/300; 365/185.25

(58) Field of Classification Search
 USPC ...................... 713/300; 365/185.25
 See application file for complete search history.

(56) References Cited

U.S. PATENT DOCUMENTS

| | | | | |
|---|---|---|---|---|
| 6,480,419 B2 * | 11/2002 | Lee | ........................... | 365/185.18 |
| 6,820,208 B2 * | 11/2004 | Hoshino et al. | ............... | 713/340 |
| 7,417,528 B2 * | 8/2008 | Kang et al. | .................. | 340/10.34 |
| 2002/0141249 A1 * | 10/2002 | Tedrow et al. | ........... | 365/189.11 |
| 2005/0082579 A1 * | 4/2005 | Horii et al. | ..................... | 257/222 |
| 2005/0207229 A1 * | 9/2005 | Takeuchi | .................. | 365/185.25 |
| 2007/0291550 A1 * | 12/2007 | Yang et al. | ............... | 365/185.28 |
| 2008/0019174 A1 * | 1/2008 | Li | ............................ | 365/185.02 |
| 2008/0094904 A1 * | 4/2008 | Byeon | ...................... | 365/185.18 |
| 2008/0279012 A1 | 11/2008 | Lee | | |

FOREIGN PATENT DOCUMENTS

| | | |
|---|---|---|
| JP | 2008065859 A | 3/2008 |
| KR | 100219505 B1 | 6/1999 |
| KR | 100699872 B1 | 3/2007 |
| KR | 1020080044401 A | 5/2008 |

\* cited by examiner

*Primary Examiner* — Thomas Lee
*Assistant Examiner* — Terrell Johnson
(74) *Attorney, Agent, or Firm* — Volentine & Whitt, PLLC

(57) ABSTRACT

Disclosed is an integrated circuit card which includes a central processing unit (CPU); a first memory block and a second memory block configured to operate responsive to a control of the CPU; and a high voltage generator block configured to generate a high voltage to be supplied to the first and second memory blocks. When bit lines of the first memory block are set by the high voltage, the CPU controls the high voltage generator block to supply the second memory block with the high voltage for a program operation of the second memory block during the program operation of the first memory block.

17 Claims, 4 Drawing Sheets

INTEGRATED CIRCUIT CARD WITH A HIGH VOLTAGE GENERATOR THAT SELECTIVELY SUPPLYS HIGH VOLTAGE TO A FIRST AND SECOND SET OF BITLINES ASSOCIATED WITH A FIRST AND SECOND MEMORY BLOCK IN PARALELL

CROSS-REFERENCE TO RELATED APPLICATION

A claim of priority under 35 U.S.C §119 is made to Korean Patent Application No. 10-2009-0022602 filed Mar. 17, 2009, the subject matter of which is hereby incorporated by reference.

BACKGROUND

The present inventive concept relates to semiconductor devices, and more particularly, to integrated circuit cards.

A smart card is a common credit card shaped portable token including embedded control logic (e.g., a microprocessor) and related memory. The smart card memory may be provided by means of an embedded memory chip. Using the data processing capabilities of the control logic and the data storage capabilities of the memory chip, a great variety of functions may be implemented (e.g., pre-paid value, credit/debit, ID, user loyalty, data storage, etc.). Unlike conventional cards including only a magnetic stripe to store data, a true smart card is able to execute data handling and/or computational logic functions.

For example, a smart card may access data in a remote database via a corresponding smart card terminal. Conventional smart cards may be generally classified as an integrated circuit (IC) microprocessor card, an IC memory card, or an optical memory card. In these forms, smart cards are being commercially adopted at an increasing rate for numerous applications.

SUMMARY

One aspect of embodiments of the inventive concept is directed to an integrated circuit (IC) card comprising; a central processing unit (CPU), a first memory block having first bit lines and a second memory block having second bit lines, wherein each one of the first and second memory blocks being configured to operate under the control of the CPU, and a high voltage generator block configured to generate a high voltage applied to the first and second memory blocks. Once the first bit lines are set up during a first program operation directed to the first memory block with the high voltage, the CPU controls the high voltage generator block to supply the second bit lines with the high voltage during a second program operation directed to the second memory block and running in parallel with the first program operation.

Another aspect of embodiments of the inventive concept is directed to a method of controlling execution of a first and second program operation in an integrated circuit (IC) card comprising; a central processing unit (CPU), a first memory block having first bit lines and a second memory block having second bit lines, and a high voltage generator block configured to generate a high voltage applied to the first and second memory blocks. The method comprises; begin executing the first program operation, and during the first program operation, generating the high voltage, applying the high voltage to the first bit lines, and once the high voltage is applied to the first bit lines generating a first interrupt, then begin executing the second program operation before completion of the first program operation, and during the second program operation receiving the first interrupt in the CPU and upon receiving the first interrupt, generating the high voltage, applying the high voltage to the second bit lines, and once the high voltage is applied to the second bit lines generating a second interrupt.

Another aspect of embodiments of the inventive concept is directed to a memory system comprising; a non-volatile memory device, and a controller configured to control the non-volatile memory device during a first program operation and a second program operation being executed in parallel, wherein the non-volatile memory device comprises; a first mat having first bit lines, a second mat having second bit lines, wherein each one of the first and second mats is configured to operate under the control of the controller, and a high voltage generator block configured to generate and apply a high voltage to the first mat during the first program operation, and generate and apply the high voltage to the second mat during the second program operation. Once the first bit lines are set up with the high voltage during the first program operation, the controller controls the high voltage generator block to switch application of the high voltage from the first bit lines to the second bit lines during the second program operation, while compensating for leakage current from the first bit lines.

BRIEF DESCRIPTION OF THE DRAWINGS

The above and other objects and features of the inventive concept will become apparent from the following description with reference to the following figures, wherein like reference numbers and labels are used to denote like or similar elements.

DETAILED DESCRIPTION OF THE EMBODIMENTS

The inventive concept will now be described in some additional detail with reference to the accompanying drawings. The inventive concept may, however, be embodied in many different forms and should not be construed as being limited to only the illustrated embodiments. Rather, these embodiments are presented as teaching examples.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
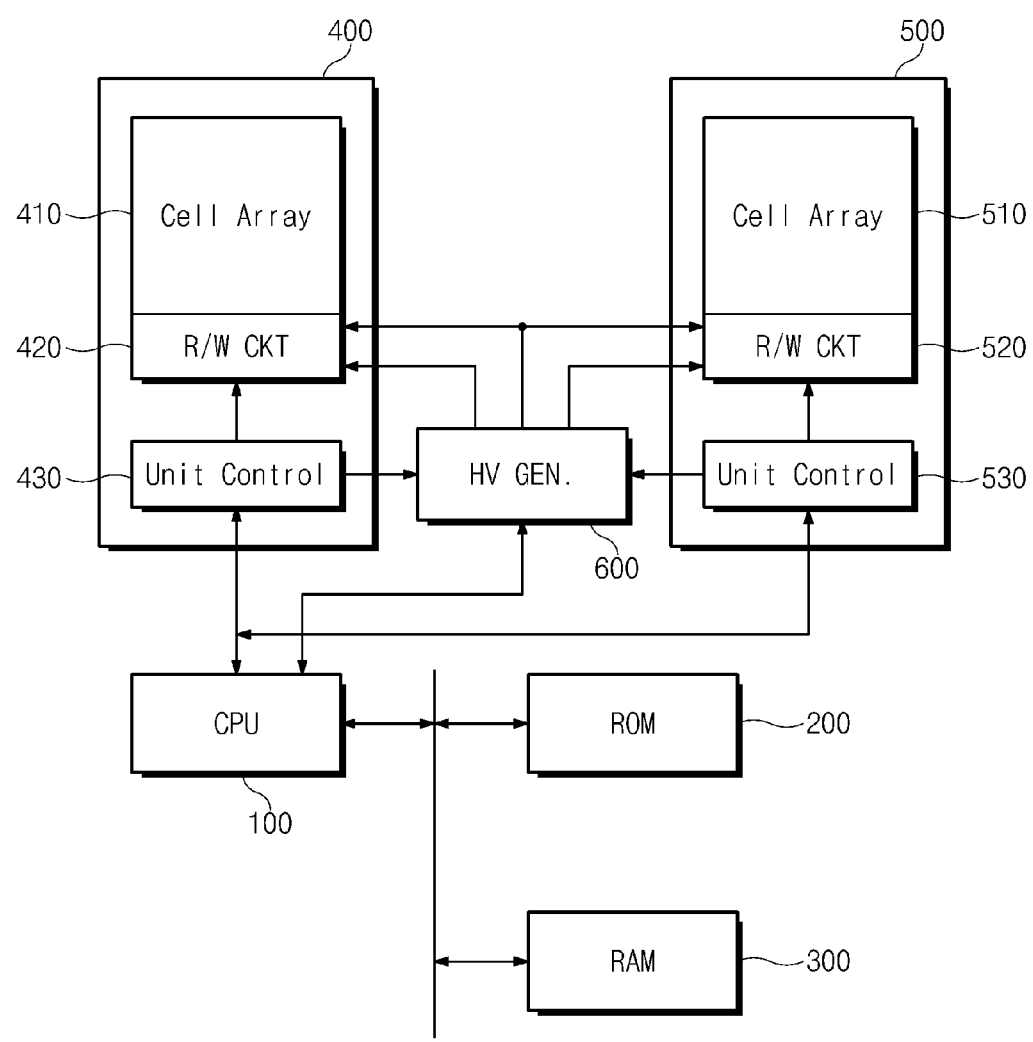
FIG. 1 is a block diagram illustrating an integrated circuit (IC) card according to an embodiment of the inventive concept.

Figure (FIG. 1 is a block diagram illustrating an integrated circuit (IC) card according to an embodiment of the inventive concept.

Referring to FIG. 1, the exemplary IC card comprises a plurality of function blocks each performing a given function. For example, the IC card may comprise a CPU 100, a ROM 200, a RAM 300, memory blocks 400 and 500, and a high voltage generator block 600. Although not illustrated in FIG. 1, the IC card may further comprise an input/output (I/O) interface configured to interface with an external device (e.g., a terminal device such as a card reader). The I/O interface may interface with the terminal device using one or more contact and/or contactless techniques and protocols, as is conventionally understood.

The CPU 100 controls overall operations of the IC card. The ROM 200 may be used as a program memory to store programs (e.g., an operating system and/or application) controlling the overall operation of the IC card. That is, the CPU 100 may control the overall operations of the IC card using programs stored in the ROM 200. The RAM 300 may be used as a data memory to temporarily store "working data" being processed by the CPU 100 during a data processing or computational operation being executed on the smart card.

As a function block, the memory block 400 comprises a memory cell array 410 formed of memory cells, a read/write circuit 420, and unit control logic 430. The memory cells may be, for example, nonvolatile memory cells including a charge storing layer such as a floating gate or a charge trap layer or memory cells having a variable resistance. But the inventive concept contemplates the possible use of a broad range of different memory cell types. The unit control logic 430 controls operation of the memory block 400 in response to control signals provided from the CPU 100. For example, the read/write circuit 420 executes read/program operations with respect to the memory cell array 410 in response to control signals received by the unit control logic 430. During read/program operations, the read/write circuit 420 supplies the memory cell array 410 with certain high voltage signals received from the high voltage generator block 600.

The memory block 500 comprises a memory cell array 510, a read/write circuit 520, and unit control logic 530, which are similarly configured as the analogous elements of the memory block 400. Accordingly, a detailed description of these elements will be omitted.

In the illustrated embodiment of FIG. 1, the high voltage generator block 600 operates in response to high voltage (HV) control signals received from the memory blocks 400 and 500, as well as from the CPU 100. The high voltage generator block 600 is configured to generate the high voltage signals necessary for read/program operations executed by the memory blocks 400 and 500. The high voltage generator block 600 in the working example is configured to be shared by the memory blocks 400 and 500 under the control of the CPU 100. That is, the (first and second) memory blocks 400 and 500 may perform read/program operations at the same time using a single high voltage generator block 600. This capability will be more fully described below.

The embodiment illustrated in FIG. 1 may be implemented as an IC card, other type of smart card. In this case, although not shown in FIG. 1, the IC card may further comprise an encryption and decryption unit, an error detecting and correcting (ECC) unit, a security sensing unit configured to prevent card hacking, a memory management unit, and other conventionally understood circuits and functional blocks.

Figure 2:
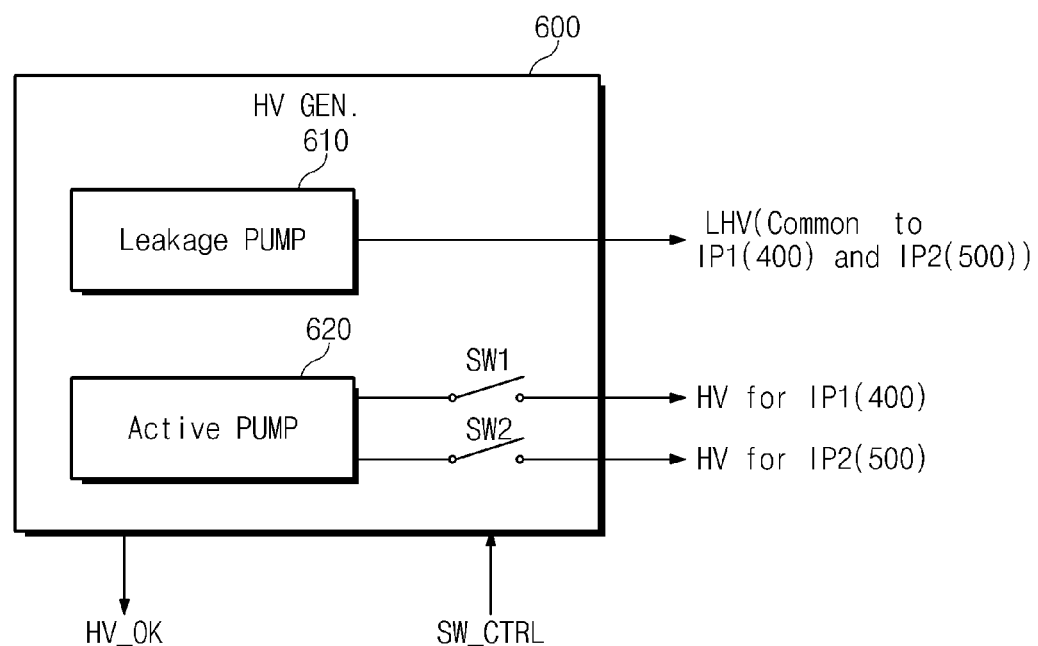
FIG. 2 is a block diagram further illustrating the high voltage generator block of FIG. 1.

FIG. 2 is a block diagram further illustrating the high voltage generator block of FIG. 1.

Referring to FIG. 2, the high voltage generator block 600 is assumed to be shared by first and second memory blocks 400 and 500 as described above with respect to FIG. 1. The high voltage generator block 600 in the illustrated embodiment comprises a leakage pump 610 and an active pump 620. The leakage pump 610 is commonly connected to the first and second memory blocks 400 and 500, and is configured to compensate for high voltage leakage from the memory blocks which are both supplied with high voltage from the active pump 620. The leakage pump 610 may be formed from a single pump, but the active pump 620 is preferably formed from a plurality of pumps connected in parallel. However, the number and arrangement of pumps forming both the leakage pump 610 and active pump 620 is deemed to fall within ordinary skill in the art and will not be further described herein other than to note that the inventive concept contemplates the incorporation of many different types of leakage and active pumps.

The active pump 620 is used to generate a high voltage (e.g., a bulk voltage, a bit line voltage, a word line voltage, or the like) necessary to execute read/program operations within the first and second memory blocks 400 and 500. For example, the high voltage may be a bit line voltage which is conventionally understood to be a negative voltage.

In one embodiment of the inventive concept, during a program operation directed to a memory block, a selected word line is driven with a program voltage, and a selected bit line (i.e., the bit line associated with memory cells to which data will be programmed) and a bulk are driven with a high negative voltage. This program method disclosed, for example, in U.S. Pat. 7,633,803 may be used for this purpose, and the subject matter of this application is hereby incorporated by reference.

The high voltage generated by the active pump 620 is supplied to either the first or second memory block 400 or 500 to be programmed via either a first or second switch SW1 or SW2. The operation of switches SW1 and SW2 is controlled by a switch control signal SW_CTRL received from the CPU 100. To "set-up" bit lines of the memory block 400 with a high voltage, the CPU 100 generates the switch control signal SW_CTRL to turn ON the first switch SW1 and turn OFF the second switch SW2. On the other hand, to set up bit lines of the memory block 500 with a high voltage, the CPU 100 generates the switch control signal SW_CTRL so as to turn OFF the first switch SW1 and turn ON the second switch SW2. Once the bit lines of the memory block to be programmed are set up with the high voltage generated by the active pump 620, the high voltage generator block 600 generates a flag signal HV_OK as an interrupt signal. The flag signal HV_OK is applied to the CPU 100. As will be described hereinafter, the CPU 100 is responsive to the flag signal HV_OK to control a program operation directed to a memory block which is different from a memory block performing a current program operation.

Instead of generation of the flag signal HV_OK by the high voltage generator block 600, unit control logic of each memory block may be configured to generate an interrupt when bit lines of a memory block to be programmed are set up with the high voltage generated by the active pump 620. In this case, the CPU 100 will control the high voltage switching operation in response to the generated interrupt. Alternatively, the unit control logic may be configured to generate an interrupt and directly control the first and second switches SW1 and SW2 when bit lines of a memory block to be programmed are set up with the high voltage generated by the active pump 620. In this case, the CPU 100 may control a program operation for another memory block in response to the interrupt.

A nonvolatile memory device may execute a program operation using the conventionally understood Fowler-Nordheim (F-N) tunneling effect or the channel hot electron (CHE) effect. In the case of F-N tunneling, current consumption by a high voltage path will be very low during a program operation, except when an increasing parasitic capacitance for the high voltage path increases to a given threshold. Once the high voltage path is set up with a required high voltage, the leakage pump 610 may be used to compensate for current consumed by leakage. For this reason, leakage compensation for a memory block performing a program operation may be made by the leakage pump 610, while the active pump 620 may be used to generate a high voltage necessary for a program operation of another memory block. This means that both the first and second memory blocks 400 and 500 may execute a program operation at the same time (i.e., in an overlapping manner). Accordingly, program performance for an IC card incorporating an embodiment of the inventive concept may be improved.

Hereafter, a program operation for an IC card according to an embodiment of the inventive concept will be more fully described with reference to the accompanying drawings.

An IC card according to an embodiment of the inventive concept is able to support an interleave program operation. With the interleave program operation, while a first memory block 400 executes a first program operation, data loading and program operations for the second memory block 500 may be executed. For ease of the description that follows, it will be assumed that the first memory block 400 begins execution of a first program operation prior to beginning of the execution of a second program operation in the second memory block 500.

First, the CPU 100 provides the first memory block 400 with first program data to be programmed. The first program data is loaded via the first read/write circuit 420 under the control of the first unit control logic 430 of the first memory block 400. Once the first program data has been loaded, the high voltage generator block 600 generates a high voltage (e.g., a bit line voltage) necessary to the first program operation under the control of the first unit control logic 430. The high voltage thus generated is then supplied to the first memory block 400. The first read/write circuit 420 drives the bit lines of the first memory cell array 410 with the high voltage. That is, the bit line voltage is provided by the high voltage generator block 600 based on the loaded first program data. During this period the driving of the bit lines is accomplished (at least primarily) by the active pump 620 of the high voltage generator block 600.

Once the bit lines of the first memory cell array 410 are set up with the required high voltage, the loaded first program data may be stored in the first memory cell array 410. Further, once the bit lines of the first memory cell array 410 are set up with the required high voltage, the high voltage generator block 600 generates the flag signal HV_OK. The CPU 100 then turns ON the second switch SW2 using the switch control signal SW_CTRL in response to the flag signal HV_OK. This means that a high voltage generated by the active pump 620 may now be switched over to the second memory block 500. Thus, while the first memory block 400 is executing the first program operation, a drop in the high voltage owing to leakage from the high voltage path may be compensated for by the leakage pump 610. Once the first program operation is completed, the first unit control logic 430 of the first memory block 400 indicates to the CPU 100 that the first program operation completed using (e.g.) an interrupt signal. The CPU 100 may now re-load additional program data to be next programmed to the first memory block 400 in response to the program complete interrupt.

Once the first program data is loaded to the first memory block 400, the CPU 100 may provide the second memory block 500 with the second program data. That is, there may arise a time during the execution of the first program operation that second program data is loaded to the second memory block 500. For example, the CPU 100 is able to provide the second memory block 500 with second program data when the flag signal HV_OK is generated. Alternatively, when an interrupt indicating execution of the first program operation is generated by the first unit control logic 430, the second program data may be provided to the second memory block 500 under the control of the CPU 100.

The second program data may thus be loaded via the second read/write circuit 520 under the control of the second unit control logic 530. Once loading of the second program data is complete, a high voltage (e.g., a bit line voltage) necessary to the execution of the second program operation may be generated by the high voltage generator block 600 under the control of the second unit control logic 530. In one embodiment, setting up of bit lines with a bit line voltage via the high voltage generator block 600 may occur in response to the flag signal HV_OK associated with the first program operation executed by the first memory block 400 and provided to the CPU 100. This means that setting up of the second memory block 500 with a high voltage is made after the setting up of the first memory block 400.

The second read/write circuit 520 now drives the bit lines of the second memory cell array 510 with the high voltage. That is, the bit line voltage is provided by the high voltage generator block 600 based on the loaded second program data. At this time, driving of the bit lines may be accomplished primarily by the active pump 620 of the high voltage generator block 600. Once the bit lines of the memory cell array 410 are set up with the required high voltage, the loaded second program data may be programmed to the second memory cell array 510. Further, once the bit lines of the second memory cell array 510 are set up with the required high voltage, the active pump 620 will generate the flag signal HV_OK. The CPU 100 may then turn ON the first switch SW1 via the switch control signal SW_CTRL in response to the flag signal HV_OK. This means that a high voltage generated by the active pump 620 may now be supplied to the first memory block 400 while the second program operation is being completed. And while the second memory block 500 performs the second program operation, a drop in the high voltage owing to leakage of the high voltage path may be compensated for by the leakage pump 610. Once the second program operation is complete, the second unit control logic 530 of the second memory block 500 may indicates such to the CPU 100 using a program complete interrupt signal. The CPU 100 may now begin re-loading additional first program data to the first memory block 400 in response to the program complete interrupt.

As described above, one program operation (and in particular a bit line set up portion of the operation) directed to either one of the first and second memory blocks 400 and 500 may be executed in parallel (i.e., at least partially overlapping) with another program operation directed to the other one of the first and second memory blocks 400 and 500. This may be accomplished by switching the active pump 620 of the high voltage generator block 600 under the control of the CPU 100 such that the required high voltage necessary to a second program operation is set up after previously setting up a high voltage necessary to a first program operation, as between the first and second memory blocks 400 and 500. In this manner, overall program performance for an IC card may be improved when dual first and second memory blocks 400 and 500 are programmed in parallel (i.e., in an interleaved manner) as above-described above.

Figure 3:
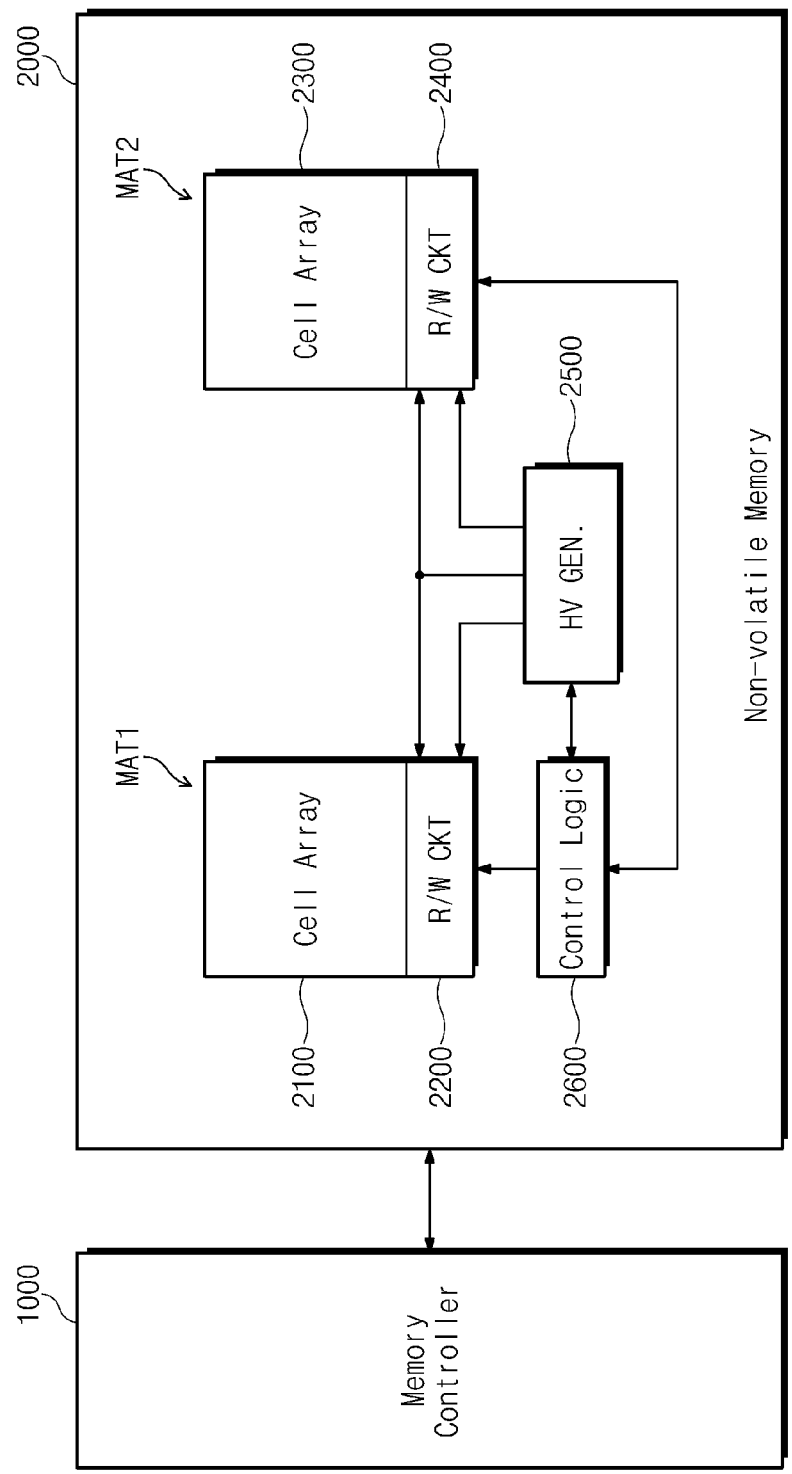
FIG. 3 is a block diagram illustrating a memory system according to an embodiment of the inventive concept.

FIG. 3 is a block diagram illustrating a memory system according to an embodiment of the inventive concept.

Referring to FIG. 3, the memory system comprises a memory controller 1000 and a non-volatile memory device 2000. The memory controller 1000 is configured to access the non-volatile memory device 2000 according to external request. The non-volatile memory device 2000 operates responsive to the control of the memory controller 1000. The non-volatile memory device 2000 comprises a plurality of mats (e.g., a first mat MAT1 and a second mat MAT2) and is configured to support an interleave program operation wherein the plurality of mats are programmed in parallel. The non-volatile memory device 2000 may include the first mat having a memory cell array 2100 and a read/write circuit 2200, the second mat having a memory cell array 2300 and a read/write circuit 2400, a high voltage generator circuit 2500, and control logic 2600.

The high voltage generator circuit 2500 is configured to be substantially identical to that illustrated in FIG. 2, and description thereof is thus omitted. But, an operation of switching an output of an active pump 620 may be made according to the control of the control logic 2600. The first and second mats may be supplied with a high voltage from the high voltage generator circuit 2500 in the same manner as described above, and may perform program operations at the same time according to the control of the control logic 2600. This may be identical to that described above, and description thereof is thus omitted.

Figure 4:
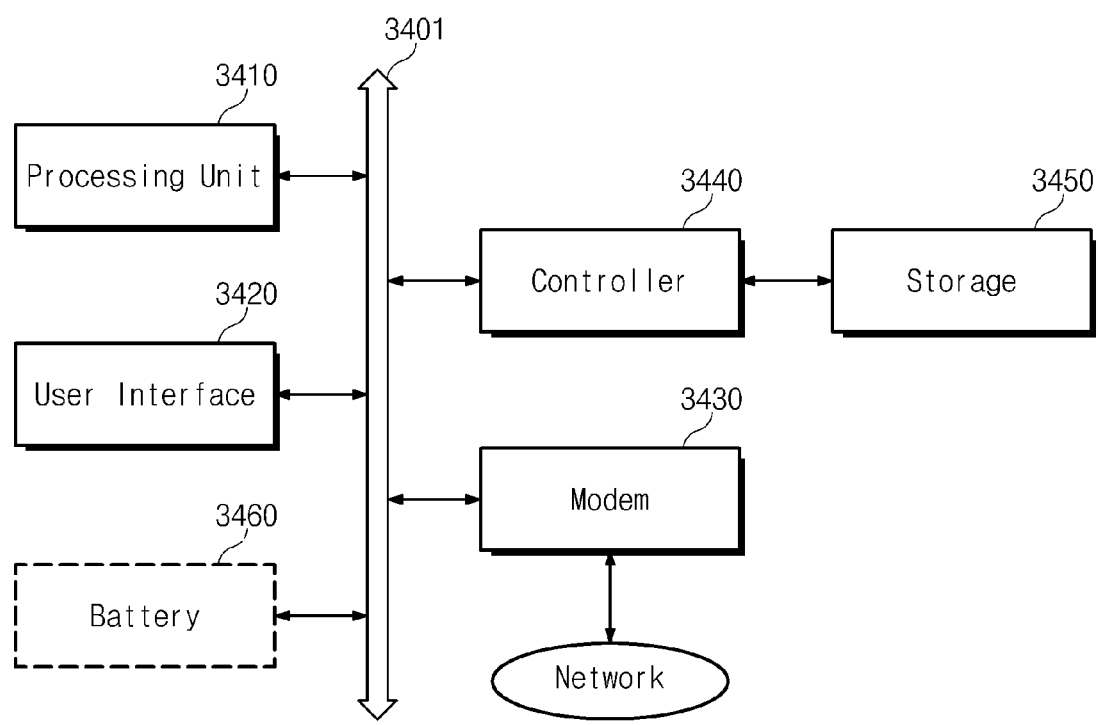
FIG. 4 is a block diagram illustrating a computational system according to an embodiment of the inventive concept.

FIG. 4 is a block diagram illustrating a computational system according to an embodiment of the inventive concept.

Referring to FIG. 4, the computational system comprises a processing unit 3410 such as a microprocessor or a central processing unit, a use interface 3420, a modem 3430 such as a baseband chipset, a memory controller 3440, and a storage media 3450 which are connected electrically with a bus 3401. The storage media 3450 and the controller 3440 may be configured as like that shown FIG. 3 in substance. In the storage media 3450, N-bit data (N is a positive integer) to be processed by the processing unit 3410 are stored through the memory controller 3440. If the computing system shown in FIG. 4 is a mobile apparatus, it is further comprised of a battery 3460 for supplying power thereto. Although not shown in FIG. 4, the computing system may be further equipped with an application chipset, a camera image processor (e.g., CMOS image sensor; CIS), a mobile DRAM, etc.

In the illustrated embodiment, the controller 3440 and the storage media 3450 may constitute a memory card, a solid state drive (SSD), or the like.

A storage media and/or a controller may be packed by various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the scope. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit (IC) card of comprising:
    a central processing unit (CPU);
    a first memory block having first bit lines and a second memory block having second bit lines, each one of the first and second memory blocks being configured to operate under the control of the CPU; and
    a high voltage generator block configured to generate a high voltage applied to the first and second memory blocks,
    wherein once the first bit lines are set up during a first program operation directed to the first memory block with the high voltage, the CPU controls the high voltage generator block to supply the second bit lines with the high voltage during a second program operation directed to the second memory block and running in parallel with the first program operation,
    the first memory block comprises a first unit control configured to generate a first program complete interrupt upon completion of the first program operation,
    the second memory block comprises a second unit control configured to generate a second program complete interrupt upon completion of the second program operation, and
    the CPU is responsive to the first program complete interrupt to load next first program data to the first memory block and the second program complete interrupt to load next second program data to the second memory block.

2. The IC card of claim 1, wherein the high voltage generator block comprises an active pump and a leakage pump, and the leakage pump is configured to compensate for leakage of the high voltage in the first memory block while the active pump applies the high voltage to the second bit lines.

3. The IC card of claim 1, wherein the high voltage generator block comprises an active pump and a leakage pump, and the leakage pump is configured to compensate for leakage of the high voltage in the second memory block while the active pump applies the high voltage to the first bit lines.

4. The IC card of claim 1 wherein the high voltage is a bit line voltage.

5. The IC card of claim 4, wherein the high voltage generator block comprises a switch configured to control application of the high voltage to either the first bits lines or the second bit lines.

6. The IC card of claim 5, wherein the CPU is responsive to the first and second program complete interrupts to control the switching operation of the switch.

7. The IC card of claim 1, wherein the first memory block comprises a first memory cell array, a first read/write circuit that receives the high voltage and controls the programming of first data to the first memory cell array in response to the high voltage, and the second memory block comprises a second memory cell array physically separate from the first memory cell array, a second read/write circuit physically separate from the first read/write circuit that receives the high voltage and controls the programming of second data to the second memory cell array.

8. The IC card of claim 1, wherein the high voltage generator is disposed between the first memory block and the second memory block.

9. A method of controlling execution of first and second program operation in an integrated circuit (IC) card comprising; a central processing unit (CPU), a first memory block having first bit lines; second memory block having second bit lines, and a high voltage generator block configured to generate a high voltage applied to the first and second memory blocks, the method comprising:

begin executing the first program operation, and during the first program operation, generating the high voltage, applying the high voltage to the first bit lines, and once the high voltage is applied to the first bit lines generating a first interrupt;

begin executing the second program operation before completion of the first program operation, and during the second program operation receiving the first interrupt in the CPU and upon receiving the first interrupt, generating the high voltage, applying the high voltage to the second bit lines, and once the high voltage is applied to the second bit lines generating a second interrupt.

10. The method of claim 9, wherein the high voltage generator block comprises an active pump and a leakage pump, and the method further comprises:

enabling the active pump to generate the high voltage applied to the first bit lines;

then upon generating the first interrupt, enabling the active pump to generate the high voltage applied to the second bit lines while enabling the leakage pump to compensate for leakage of the high voltage applied to the first bit line while the active pump applies the high voltage to the second bit lines.

11. The method of claim 10, wherein the high voltage generator block comprises a switch configured in response to a switch control signal received from the CPU to selectively enable the active pump and leakage pump.

12. The method of claim 10, further comprising:

generating a first program complete interrupt once first program data associated with the first program operation is loaded; and generating a second program complete interrupt once second program data associated with the second program operation is loaded.

13. A memory system comprising:

a non-volatile memory device; and a controller configured to control operation of the non-volatile memory device during a first program operation and a second program operation, wherein the first program operation and the second program operation are, at least in part, executed in parallel, the non-volatile memory device comprising:

a first mat comprising first bit lines and a first unit control configured to generate a first program complete interrupt upon completion of the first program operation, a second mat comprising second bit lines and a second unit control configured to generate a second program complete interrupt upon completion of the second program operation, wherein each one of the first and second mats is configured to operate under the control of the controller; and a high voltage generator block configured to generate and apply a high voltage to the first mat during the first program operation, and to generate and apply the high voltage to the second mat during the second program operation, wherein once the first bit lines are set up with the high voltage during the first program operation, the controller controls the high voltage generator block to switch application of the high voltage from the first bit lines to the second bit lines during the second program operation, and the controller is responsive to the first program complete interrupt to load next first program data to the first mat and the second program complete interrupt to load next second program data to the second mat.

14. The memory system of claim 13, wherein the high voltage generator block comprises an active pump and a leakage pump, and the leakage pump is configured to compensate for the leakage from the first bit lines while the active pump applies the high voltage to the second bit lines.

15. The memory system of claim 13 wherein the high voltage is a bit line voltage.

16. The memory system of claim 13, wherein the first mat comprises a first memory cell array, a first read/write circuit that receives the high voltage and controls the programming of first data to the first mat in response to the high voltage, and the second mat physically separate from the first mat and comprising a second memory cell array physically separate from the first memory cell array, a second read/write circuit physically separate from the first read/write circuit and that receives the high voltage and controls the programming of second data to the second memory cell array.

17. The memory system of claim 13, wherein the high voltage generator is disposed between the first mat and the second mat.

* * * * *